United States Patent [19]

Sung et al.

[11] Patent Number: 5,789,296
[45] Date of Patent: Aug. 4, 1998

[54] METHOD FOR MANUFACTURING SPLIT GATE FLASH MEMORY

[75] Inventors: Kuo-Tung Sung; Chih-Hsun Chu, both of Hsinchu, Taiwan

[73] Assignee: Mosel Vitelic Inc., Taiwan

[21] Appl. No.: 764,612

[22] Filed: Dec. 5, 1996

[51] Int. Cl.⁶ .................................. H01L 21/8247
[52] U.S. Cl. .................. 438/266; 438/596; 438/657
[58] Field of Search ........................ 438/257, 265, 438/266, 267, 593, 596, 655, 656, 657

[56] References Cited

U.S. PATENT DOCUMENTS

| 4,443,930 | 4/1984 | Hwang et al. | 438/657 |
| 4,744,861 | 5/1988 | Matsunaga et al. | 438/593 |
| 5,231,041 | 7/1993 | Arima et al. | 438/267 |
| 5,371,028 | 12/1994 | Koh | 438/594 |

*Primary Examiner*—Chandra Chaudhari
*Attorney, Agent, or Firm*—Fish & Richardson, P.C.

[57] ABSTRACT

A method for forming a structure of a split gate flash memory is provided. The method includes steps of: a) preparing a substrate having an oxide layer; b) forming a first conducting layer over the oxide layer; c) etching a portion of the first conducting layer to form a word line structure for the flash memory; d) forming a spacer layer over the word line structure to be a side-wall portion of a word-line protecting layer; e) oxidizing the word-line protecting layer to form a dielectric layer; and f) forming a floating gate layer over the dielectric layer.

10 Claims, 2 Drawing Sheets

METHOD FOR MANUFACTURING SPLIT GATE FLASH MEMORY

FIELD OF THE INVENTION

The present invention relates to a method for manufacturing a split flash memory, especially relate to a method for manufacturing a split gate flash memory having better charge retention characteristics.

BACKGROUND OF THE INVENTION

An electric device having a floating-gate transistor such as a split gate EEPROM has been widely used. The floating gate is used for retaining the charge and thus storing the information in the memory cell.

In such a memory cell, there further includes a word line and control gate structure for inputting/outputting the data. Conventionally, most of the word line structures on the substrates are located above the floating gates. However, in some special cases, one of which is shown in FIGS. 1(a)–1(c), the floating gate is disposed above the word line structure. The conventional process of manufacturing such a device can be illustrated as follows:

a. forming a silicon dioxide layer 2 over a silicon substrate 1;

b. depositing a first polysilicon layer on the silicon dioxide layer 2 and defining the first polysilicon layer to form the polysilicon word line structure 3;

c. forming a dielectric layer 4 over the polysilicon word line structure 3 by a chemical vapor deposition (CVD) or by directly oxidizing the surface portion of the polysilicon word line structure 3; and d. forming a second polysilicon layer 5 over the dielectric layer 4 and defining the second polysilicon layer 5 to form the floating gate.

The conventional process exists several problems and defects as follows:

1. If the dielectric layer 4 is not thick enough, the charge retaining ability of the memory device will be decreased, that is to say, the charge retained in the floating gate will be easily lost, which may cause a data storage error in the memory cell.

2. The resistivity of a polysilicon word line structure 3 depends on the dopant concentration of the first polysilicon layer. If a lower resistivity is required, the dopant concentration must be increased, and the poly grain size and the doping non-uniformity are also increased. Since the oxidation rate is direct proportional to the dopant concentration, the non-uniform dopant concentration will cause a non-uniform dielectric layer 5, which will reduce the quality of the memory device greatly.

3. If the dielectric layer 4 is too thick due to the high dopant concentration of the first polysilicon layer, the program efficiency of the cell will be decreased due to the decreased electric field, as the same voltage must drop accross a longer distance. The procedure of directly oxidizing the surface portion of the polysilicon word line structure 3 will obtain a thick dielectric layer which has a good charge retention ability. But, on the other hand, the gate coupling ratio and the overall speed performance of the memory device will be decreased.

It is thus attempted by the applicant to dissolve the problems mentioned above.

SUMMARY OF THE INVENTION

An object of the present invention is to provide a method for manufacturing a split gate flash memory device having a better charge retention characteristics.

The other object of the present invention is to provide a floating-gate-above-word-line split gate flash memory having a better speed performance.

Another object of the present invention is to provide a floating-gate-above-word-line split gate flash memory by using a polycide word line without reducing the charge retention property of the split gate flash memory.

The present invention provides a method for forming a structure of a split gate flash memory. The method includes steps of: a) preparing a substrate having an oxide layer; b) forming a first conducting layer over the oxide layer; c) etching a portion of the first conducting layer to form a word line structure for the flash memory; d) forming a spacer layer over the word line structure to form a side-wall portion of a word-line protection layer; e) oxidizing the word-line protection layer to form a dielectric layer; and f) forming a floating gate layer over the dielectric layer.

In accordance with one aspect of the present invention, the first conducting layer is preferably a polycide layer.

In accordance with another aspect of the present invention, the step b) preferably includes steps of: b1) forming a first polysilicon layer over the oxide layer; and b2) forming a silicide layer over the first polysilicon layer.

In accordance with another aspect of the present invention, the silicide layer is preferably a tungsten silicide layer.

In accordance with another aspect of the present invention, the step b) preferably further includes a step of: b3) forming a cap-polysilicon layer over the silicide layer.

In accordance with another aspect of the present invention, the step d) preferably includes steps of: d1) forming a second polysilicon layer over the word line structure; and d2) etching the second polysilicon layer to form the spacer layer.

In accordance with another aspect of the present invention, in the step d) the word-line protection layer preferably includes the spacer layer and a surface portion of the cap-polysilicon layer.

In accordance with one aspect of the present invention, the first conducting layer is preferably a third polysilicon layer.

In accordance with another aspect of the present invention, the step f) preferably further includes steps of: f1) forming a second conducting layer over the word line structure; and f2) etching the second conducting layer to form the floating gate layer.

In accordance with another aspect of the present invention, the second conducting layer is preferably a fourth polysilicon layer.

The present invention further provides a structure of a split gate flash memory device, includes a substrate having an oxide layer; a polycide word line structure forming above the oxide layer; a dielectric layer covering the polycide word line structure; and a floating gate forming above the dielectric layer.

In accordance with another aspect of the present invention, the polycide word line structure preferably includes: a first polysilicon layer forming above the oxide layer; and a tungsten silicide layer forming above the first polysilicon layer.

In accordance with another aspect of the present invention, the polycide word line preferably further includes a cap-polysilicon layer formed above the tungsten silicide layer.

In accordance with another aspect of the present invention, the floating gate is preferably formed by a second polysilicon layer.

3

The present invention may best be understood through the following description with reference to the accompanying drawings, in which:

DETAILED DESCRIPTION OF THE PREFERRED EMBODIMENTS

Figure 1A:
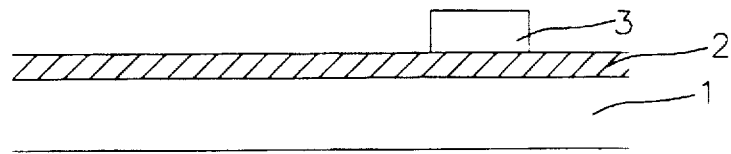
FIGS. 1(a)-1(c) illustrate the processes of a conventional method for manufacturing a split gate flash memory.
Figure 1B:
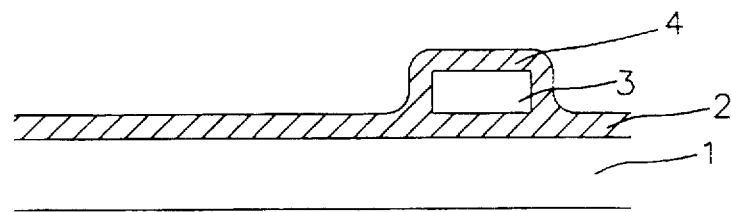
Figure 1C:
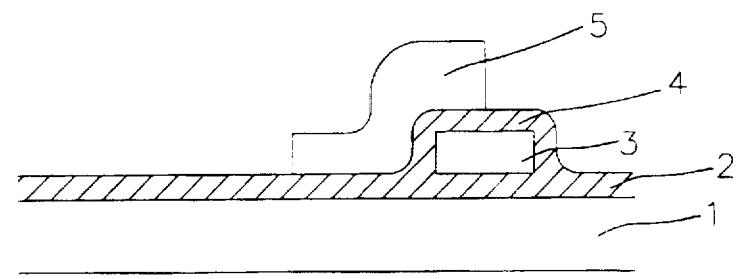

Referring to FIGS. 2(a)-2(e), the present invention uses a polycide word line structure 19 in a split gate flash memory which has a structure in which the floating gate 18 is disposed above the word line structure 19 on the silicon substrate 11. Instead of directly oxidizing the surface of the word line structure (or so called the first conducting layer) 19, the present invention applies a polysilicon spacer layer 16a over the surface of the word line structure 19 to be oxidized and thus forms a side wall of the inter-poly dielectric layer 17.

The word line structure 19 includes a polycide layer 1134. The polycide layer 1134 includes a first polysilicon layer 13 and a tungsten silicide layer 14. The polysilicon spacer layer 16a is formed by an polysilicon layer 16 with an anisotropic dry etching. The polysilicon spacer layer 16 is properly doped to form a desired thickness for the dielectric layer 17. With the use of the properly-doped polysilicon spacer layer 16a, the formation of the dielectric layer 17 by oxidization will no more be influenced by the dopant concentration of the first conducting layer 19. Of course, the polycide layer 1134 can be replaced by merely the polysilicon layer 13 without the tungsten silicide layer 14.

Preferably, there might be a cap-polysilicon layer 15 on top surface of the tungsten silicide layer 14. A word-line protection layer formed by the polysilicon spacer layer 16a and the cap-polysilicon layer 15 covers the surface of the word line structure 19 and will form the dielectric layer 17 after oxidized. The thickness of the inter-poly dielectric layer 17 can be optimized by controlling the oxidization process and the doping of the polysilicon spacer layer 16a according to a designed requirement. Because it is the word-line protection layer, instead of the tungsten silicide layer, to be oxidized, the problems caused by the residual tungsten inside the dielectric layer are avoided. The existence of the cap-polysilicon layer 15 will minimize the material property change due to the subsequent oxidation process. As a result, less stress will be induced and problems with film peeling are capable of being minimized. The film peeling problem may seriously degrade the yield.

The process of manufacturing a split gate flash memory as described above can be indicated by the preferred embodiment of the present invention as shown in FIGS. 2(a)-2(e).

Figure 2A:
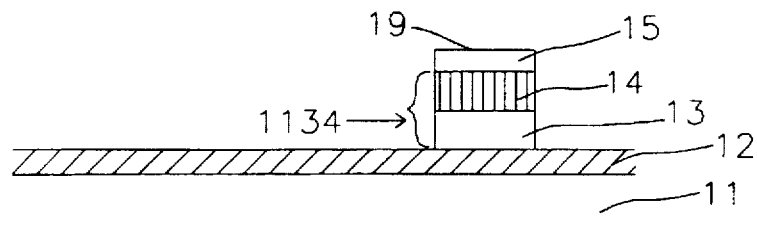
FIGS. 2(a)-2(e) illustrate the processes of a preferred embodiment of a method for manufacturing a split gate flash memory according to the present invention.

FIG. 2(a) includes steps of:

a1) preparing a silicon substrate 11 having a silicon dioxide layer 12;

a2) depositing a polysilicon layer 13 over the silicon dioxide layer 12;

a3) depositing a tungsten silicide layer 14 over the polysilicon layer 13;

a4) depositing a cap-polysilicon layer 15 over the tungsten silicide layer 14; and a5) executing an etching process to obtain the word-line structure 19 on the silicon substrate 11.

It is notable that step a3) and a4) may be neglected.

Figure 2B:
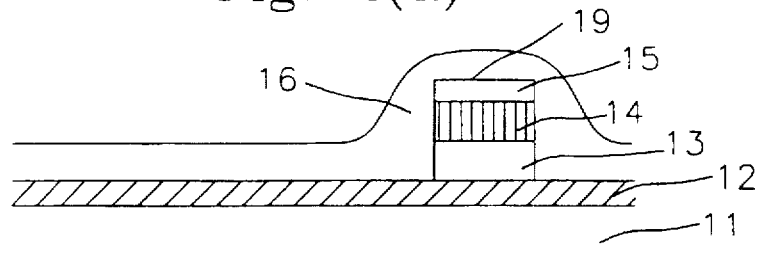

FIG. 2(b) includes a step of:

b1) depositing an properly doped polysilicon layer 16 over the word-line structure 19 on the silicon substrate 11.

Figure 2C:
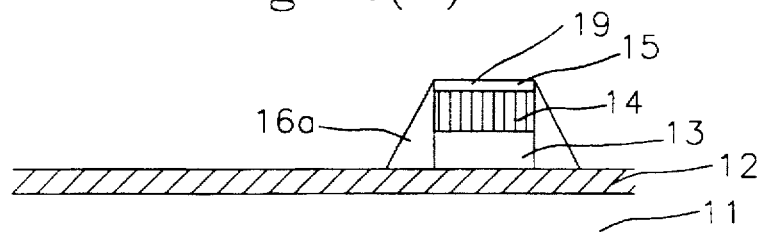

FIG. 2(c) includes a step of:

c1) executing a dry etching process to obtain the side-wall spacer 16a. The shape of the poly spacer 16a may be conformal to the poly gate edge or may be like that of the traditional taper side-wall.

Figure 2D:
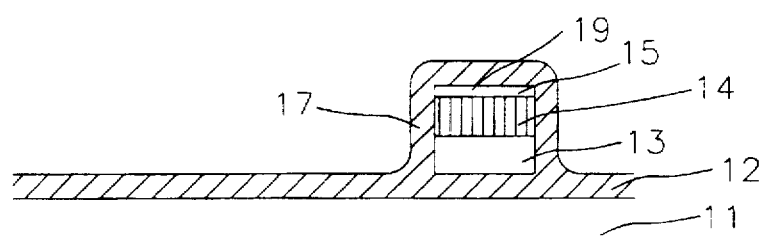

FIG. 2(d) includes a step of:

d1) executing an oxidization process to form the dielectric layer 17.

Figure 2E:
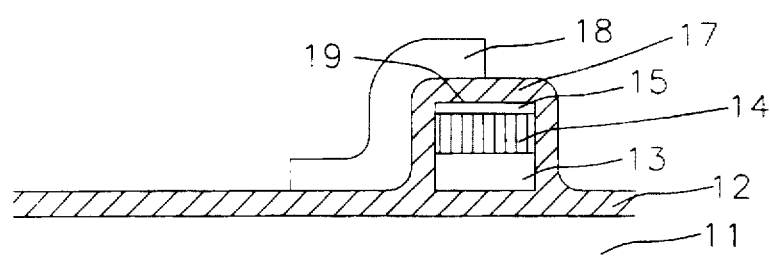

FIG. 2(e) includes a step of:

e1) depositing a polysilicon layer 18 over the dielectric layer 17 on the silicon substrate 11. The polysilicon layer, or so called the second conducting layer 18, will serve as a floating gate of the split gate flash memory of the present invention.

The structure indicated in FIG. 2(e) may form a flash memory cell itself of become a part of a more complex flash memory cell. The source/drain implanting process will be performed after the etching of the second polysilicon layer 18, if the cell is manufactured by a double-poly process. It may also be performed later in a manufacturing process for a more complex flash memory.

Besides, the word line 19 may have a structure selected from a polysilicon layer, a polysilicon layer/tungsten suicide layer and a polysilicon layer/tungsten layer/cap-polysilicon layer.

To sum up, according to the method of forming an inter-poly dielectric layer between a word line and a floating gate provided by the present invention, it is possible to apply a polycide word line having a relative low resistivity in a split gate flash memory without degrading the charge retention property of the floating gate. Such a device may have a better speed performance and gate covering ratio, and a reduced word line delay and power consumption. Thus, a high quality and more reliable split gate flash memory is obtained.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming a structure of a split gate flash memory, comprising steps of:

a) preparing a substrate having an oxide layer;

b) forming a first conducting layer over said oxide layer;

c) etching a portion of said first conducting layer to form a word line structure for said flash memory;

d) forming a spacer layer over said word line structure to be a side-wall portion of a word-line protecting layer;

e) oxidizing said word-line protecting layer to form a dielectric layer; and f) forming a floating gate layer over said dielectric layer.

2. A method according to claim 1 wherein said first conducting layer is a polycide layer.

3. A method according to claim 2 wherein said step b) includes steps of:

b1) forming a first polysilicon layer over said oxide layer; and b2) forming a silicide layer over said first polysilicon layer.

4. A method according to claim 3 wherein said silicide layer is a tungsten silicide layer.

5. A method according to claim 3 wherein said step b) further includes a step of:

b3) forming a cap-polysilicon layer over said silicide layer.

6. A method according to claim 5 wherein said step d) includes steps of:

d1) forming a second polysilicon layer over said word line structure; and d2) etching said second polysilicon layer to form said spacer layer.

7. A method according to claim 6 wherein in said step d) said word-line protection layer includes said spacer layer and a surface portion of said cap-polysilicon layer.

8. A method according to claim 1 wherein said first conducting layer is a third polysilicon layer.

9. A method according to claim 1 wherein said step f) includes steps of:

f1) forming a second conducting layer over said word line structure; and f2) etching said second conducting layer to form said floating gate layer.

10. A method according to claim 9 wherein said second conducting layer is a fourth polysilicon layer.

* * * * *